(12) United States Patent
Kobayashi

(10) Patent No.: US 6,863,590 B2
(45) Date of Patent: Mar. 8, 2005

(54) WAFER PLANARIZATION APPARATUS

(75) Inventor: Kazuo Kobayashi, Mitaka (JP)

(73) Assignee: Tokyo Seimitsu Co., Ltd., Tokyo (JP)

( * ) Notice: Subject to any disclaimer, the term of this patent is extended or adjusted under 35 U.S.C. 154(b) by 55 days.

(21) Appl. No.: 10/147,803

(22) Filed: May 20, 2002

(65) Prior Publication Data

US 2002/0173229 A1 Nov. 21, 2002

(30) Foreign Application Priority Data

May 21, 2001 (JP) ............................. 2001-150637

(51) Int. Cl.[7] .......................... B24B 49/00; B24B 51/00
(52) U.S. Cl. ................... 451/5; 451/6; 451/41; 451/63; 451/287
(58) Field of Search .................. 451/5, 41, 6, 54, 451/63, 283–290

(56) References Cited

U.S. PATENT DOCUMENTS

| | | | |
|---|---|---|---|
| 5,336,319 A | * 8/1994 | Narang et al. | 118/211 |
| 5,974,903 A | 11/1999 | Shirley et al. | |
| 6,075,375 A | 6/2000 | Burkhart et al. | |
| 6,132,289 A | * 10/2000 | Labunsky et al. | 451/6 |
| 6,431,949 B1 | * 8/2002 | Ishikawa et al. | 451/5 |
| 6,465,330 B1 | * 10/2002 | Takahashi et al. | 438/464 |
| 6,569,282 B1 | * 5/2003 | Arisa | 156/345.21 |
| 6,583,032 B1 | * 6/2003 | Ishikawa et al. | 438/462 |
| 6,626,736 B2 | * 9/2003 | Tsujimura et al. | 451/9 |
| 6,629,883 B2 | * 10/2003 | Katsuoka et al. | 451/332 |
| 2002/0002029 A1 | * 1/2002 | Kimura et al. | 451/41 |
| 2002/0006768 A1 | * 1/2002 | Wada et al. | 451/41 |

FOREIGN PATENT DOCUMENTS

| | | |
|---|---|---|
| EP | 0 848 417 A1 | 12/1996 |
| EP | 0 841 695 A2 | 5/1998 |
| EP | 0981156 A2 * | 2/2000 |
| EP | 1 054 437 A2 | 11/2000 |

OTHER PUBLICATIONS

JP 11–161916 A2, Fuji Electrochem Co., Ltd., Jun. 18, 1999, English Patent Abstract.
JP 10–092657 A2, Kenwood Corp., Apr. 10, 1998, English Patent Abstract.
JP 10–074774 A2, Matsushita Electric Ind., Co., Ltd., Mar. 17, 1998, English Patent Abstract.
European Search Report Dated Jan. 7, 2004.

* cited by examiner

*Primary Examiner*—M. Rachuba
(74) *Attorney, Agent, or Firm*—Nixon Peabody LLP; David S. Safran

(57) ABSTRACT

The wafer planarization apparatus comprises a processing part which holds a wafer through a protective sheet adhering to the obverse of the wafer and processes the reverse of the wafer, an inspecting device which inspects the wafer having been processed by the processing part, a frame adhering part which adheres a frame through a sheet to the reverse of the wafer having been inspected by the inspecting device, a peeling part which peels the protective sheet from the wafer to which the frame has been adhered, and a transporting device which transports the wafer between the processing part, the inspecting device, the frame adhering part, and the peeling part, so that the series of processing for the wafer can be systematized in line.

5 Claims, 7 Drawing Sheets

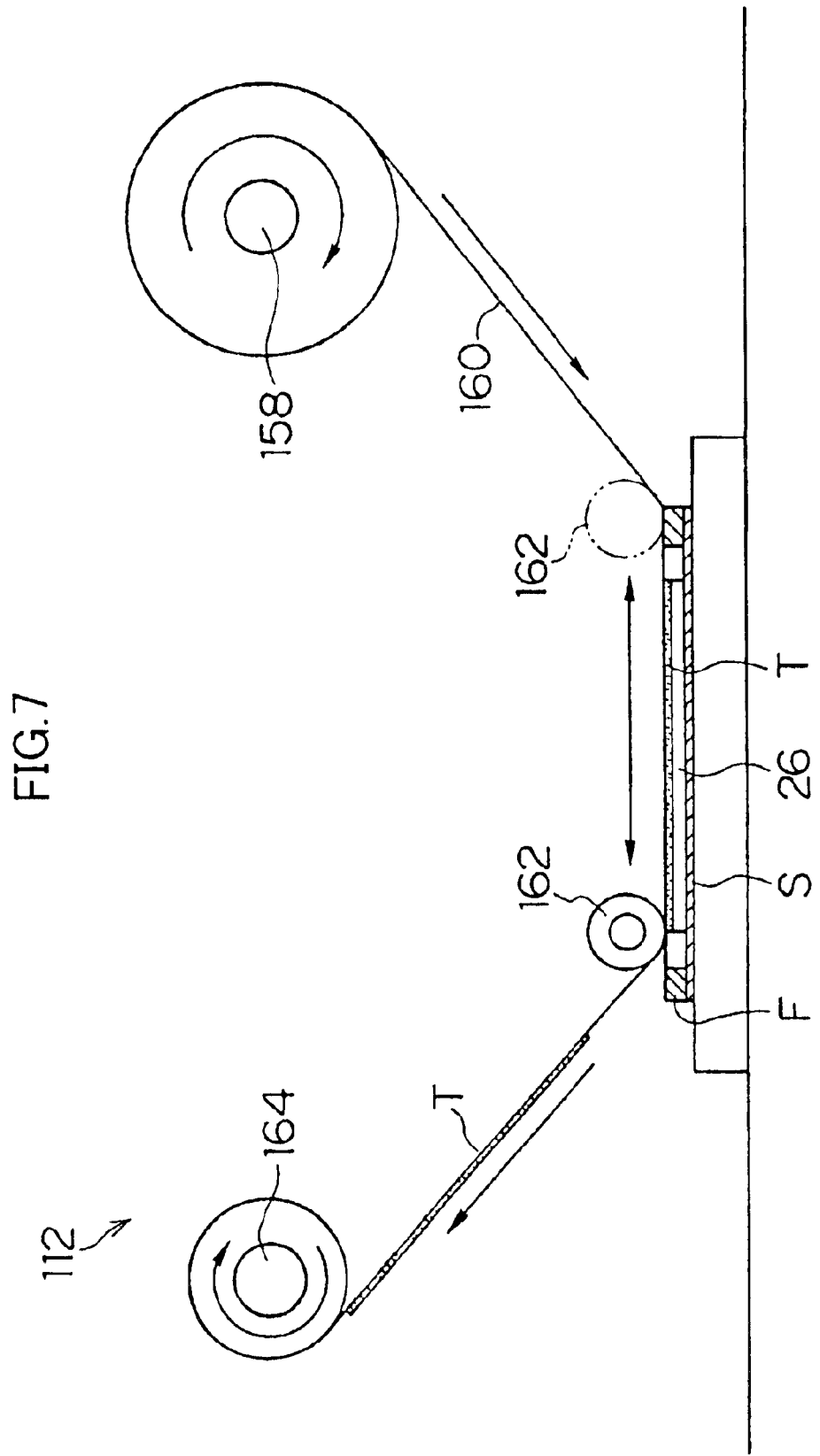

WAFER PLANARIZATION APPARATUS

BACKGROUND OF THE INVENTION

1. Field of the Invention

The present invention relates to a wafer planarization apparatus, and more particularly to a wafer planarization apparatus for manufacture of a semiconductor wafer, where the reverse, on which no chip is formed, of a semiconductor wafer is ground, the ground wafer is adhered on a wafer frame for dicing through a sheet, and a protective sheet previously adhered on the surface of the wafer is peeled from the wafer.

2. Description of the Related Art

In recent years, thinner semiconductor elements are needed because of demand for IC cards. In the manufacture of the semiconductor elements, a predetermined circuit pattern (chips) is formed on the obverse of a semiconductor wafer, and the reverse of the semiconductor wafer is then ground by a planarization apparatus or a back grinder so that the semiconductor wafer is thinned. Since the planarization apparatus grinds the reverse of the wafer while holding the obverse of the wafer, on which the chips are formed, with a holding part, it is necessary to protect the chips from the holding part, and a chip protective sheet is adhered to the obverse of the wafer before the grinding process.

The wafer of which reverse has been ground by the planarization apparatus is taken out of the planarization apparatus and transported to an inspecting stage, and the wafer is inspected visually for the thickness, cracks and so forth. The wafer that is determined as of sufficient quality in the inspecting stage is moved to a wafer frame adhering stage or a frame mounter, and a wafer frame is adhered to the wafer through a sheet. Then, the protective sheet is peeled from the wafer. Thereafter, the wafer is set to a cutting part of a dicing machine with the wafer frame, and is divided into chips by a blade of the dicing machine.

As described above, conventionally, the planarization apparatus, the inspecting stage and the frame mounter are separately provided, and the operator transfers the wafers processed in one of the apparatuses to another so that a series of processes (grinding, inspection, adhesion of the wafer frame, and peeling of the protective sheet) is carried out.

Recently, it is proposed to provide a robot for transporting the wafer ground in the planarization apparatus to the frame mounter so that the processes of grinding of the wafer, adhesion of the wafer frame, and peeling of the protective sheet are systematized in line. However, the wafer planarization apparatus to be conventionally systematized in line is not provided with the inspecting stage, so that there is a problem that even the imperfect wafer that should be rejected is transported to the frame mounter and is adhered to the wafer frame.

For example, the wafer with the thickness over the predetermined thickness should be returned to the planarization apparatus so as to be processed again. In the wafer planarization apparatus with no inspecting stage, however, even the overthick wafer is adhered to the wafer frame. It is difficult to process again the wafer adhered to the wafer frame, and the yield of wafers thus deteriorates.

SUMMARY OF THE INVENTION

In view of the foregoing, it is an object of the present invention to provide a wafer planarization apparatus in which the series of processing of grinding a wafer, inspecting the wafer, adhering the wafer to a frame, then peeling a protective sheet can be systematized in line.

In order to achieve the above-described object, the present invention is directed to a wafer planarization apparatus, comprising: a processing part which holds a wafer through a protective sheet adhering to a first surface of the wafer and processes a second surface of the wafer; an inspecting device which inspects the wafer having been processed by the processing part; a frame adhering part which adheres a frame through a sheet to the second surface of the wafer having been inspected by the inspecting device; a peeling part which peels the protective sheet from the wafer to which the frame has been adhered; and a transporting device which transports the wafer between the processing part, the inspecting device, the frame adhering part, and the peeling part.

According to the present invention, the wafer planarization apparatus has the processing part, the frame adhering part, and the protective sheet peeling part, and is provided with the transporting device, which transports the wafer from the processing part to the frame adhering part and from the frame adhering part to the protective sheet peeling part, so that the series of processing the wafer, adhering the wafer to the frame, then peeling the protective sheet is systematized in line. The wafer planarization apparatus is further provided with the wafer inspecting device, which inspects the processed wafer, between the processing part and the frame adhering part, so that the series of processing the wafer, inspecting the wafer. adhering the wafer to the frame, then peeling the protective sheet is systematized in line.

Preferably, the transporting device transports the wafer having been processed by the processing part to the inspecting device; and the transporting device transports the wafer having been accepted by the inspecting device to the frame adhering part, and transports the wafer having been rejected by the inspecting device to the processing part so as to reprocess the wafer. Thus, the wafer planarization apparatus can improve the yield of the wafer.

Preferably, the inspecting device comprises a thickness measuring device which measures a thickness of the wafer, and the inspecting device rejects the wafer of which thickness is thicker than a predetermined thickness. The inspecting device may comprise a visual inspecting device which visually inspects the wafer for breaks.

BRIEF DESCRIPTION OF THE DRAWINGS

The nature of this invention, as well as other objects and advantages thereof, will be explained in the following with reference to the accompanying drawings, in which like reference characters designate the same or similar parts throughout the figures and wherein:

FIG. 7 is a side view showing a structure of a protective sheet peeling part the wafer processing apparatus in FIG. 5.

DETAILED DESCRIPTION OF THE PREFERRED EMBODIMENTS

Hereunder preferred embodiments for a wafer planarization apparatus of the present invention will be described in detail in accordance with the accompanied drawings.

Figure 1:
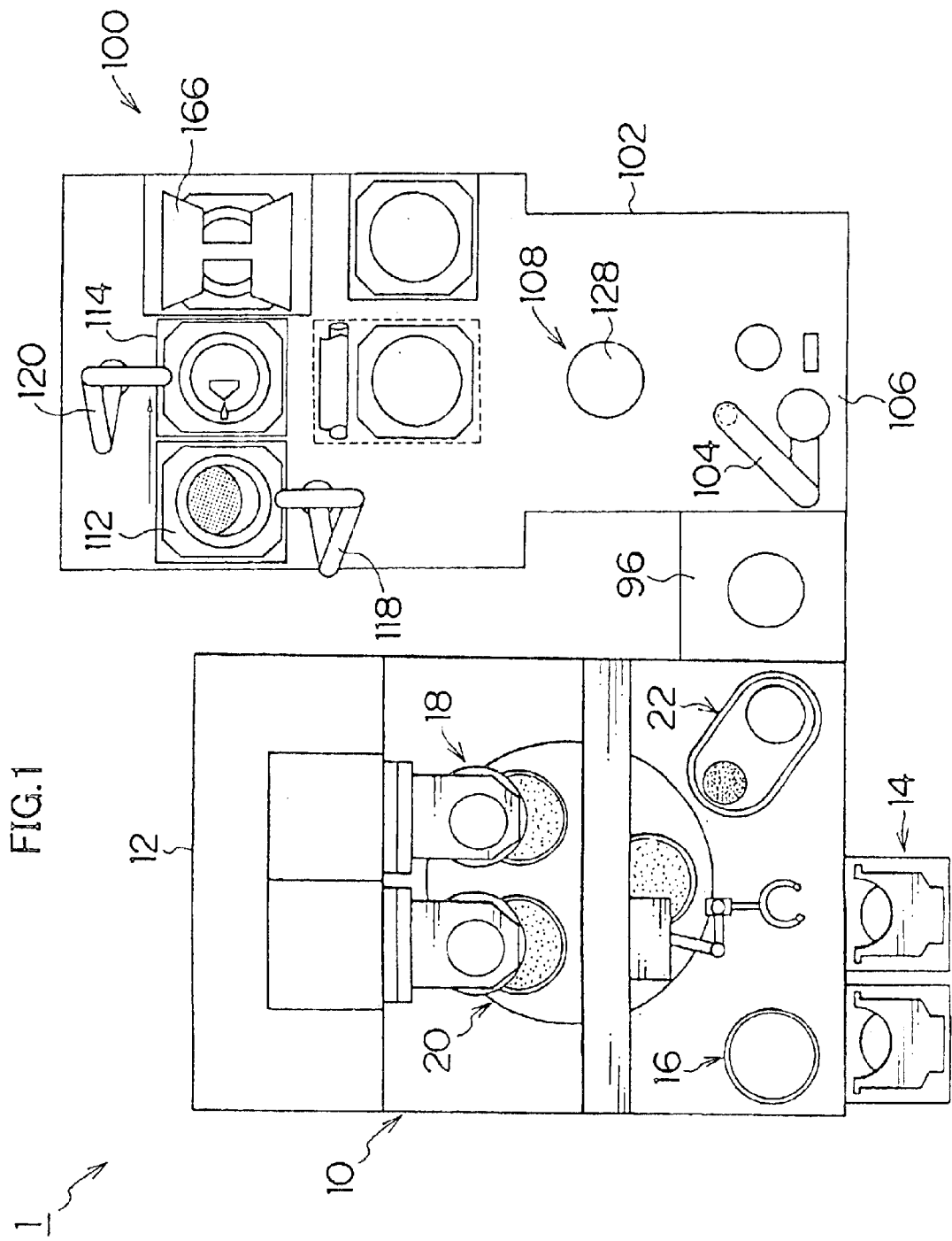
FIG. 1 is a plan view of a planarization apparatus for a semiconductor wafer of a present embodiment.

FIG. 1 is a plan view showing a structure of a wafer planarization apparatus 1 according to an embodiment of the present invention. In the wafer planarization apparatus 1, processes of grinding of a wafer, inspection of the wafer, adhesion of a wafer frame to the wafer, and peeling of a protective sheet from the wafer are systematized in line. The wafer planarization apparatus 1 comprises a processing part or a back grinder 10 by which the wafer is processed to have a thickness of about 30 micrometers, and a wafer processing apparatus 100, in which a wafer frame is adhered to the wafer of which reverse has been ground and the protective sheet is peeled from the wafer.

Figure 2:
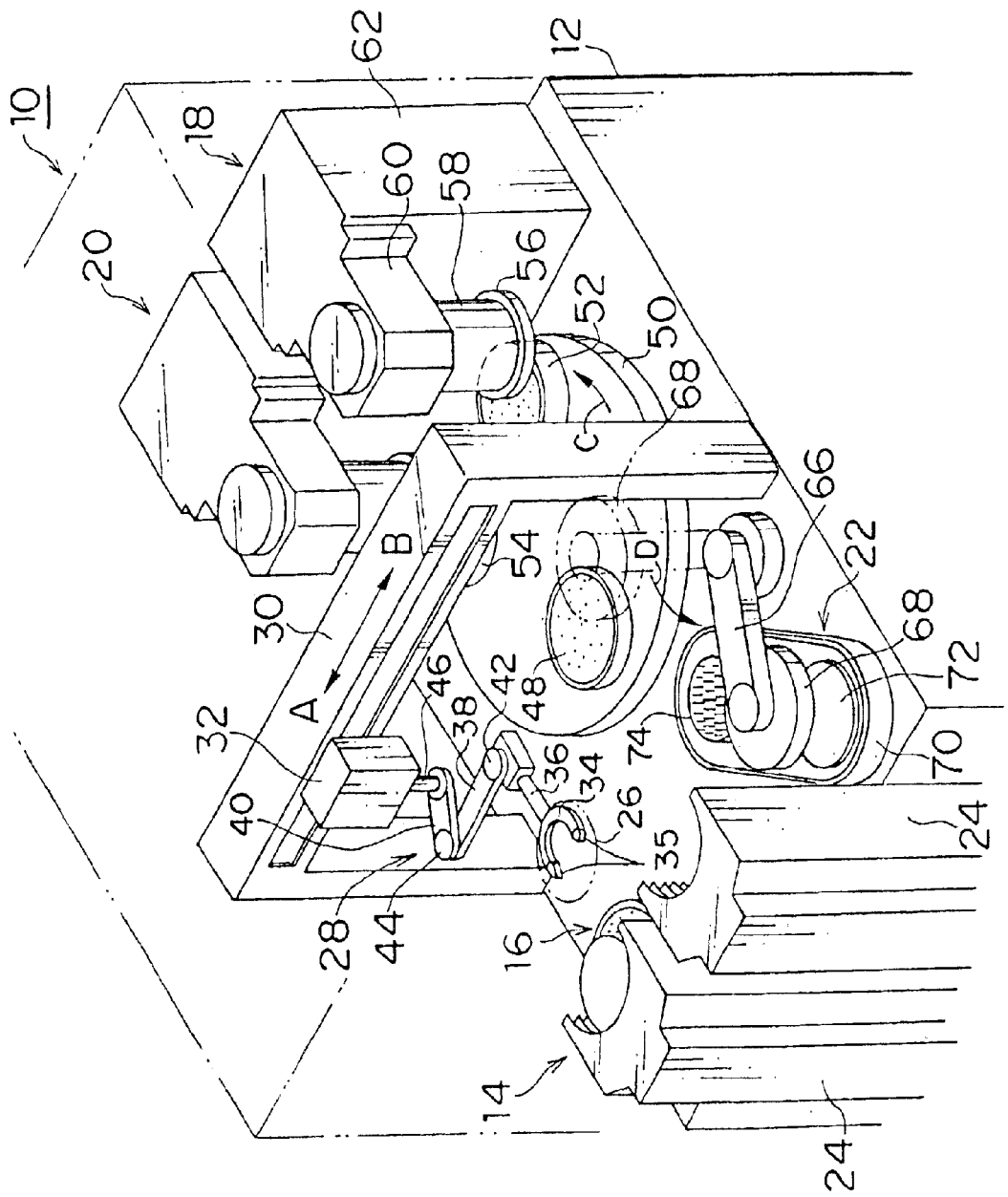
FIG. 2 is a perspective view showing a structure of a back grinder in FIG. 1.
Figure 3:
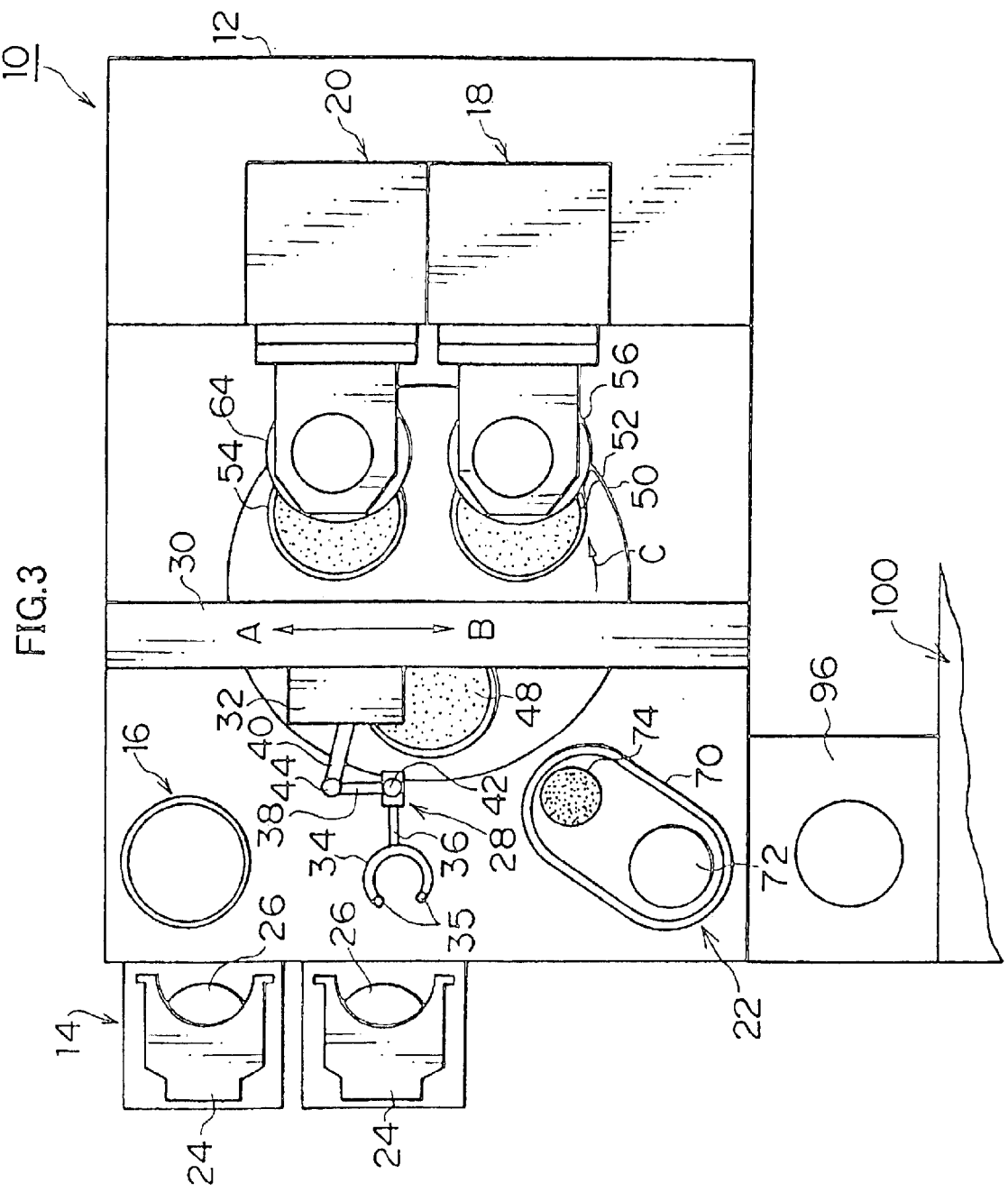
FIG. 3 is a plan view showing a structure of the back grinder in FIG. 2.

As shown in FIGS. 2 and 3, a body 12 of the back grinder 10 is provided with a cassette housing stage 14, an alignment stage 16, a rough grinding stage 18, a finishing grinding stage 20 and a cleaning and thickness measuring stage (corresponding to a wafer inspecting device and a thickness measuring device) 22.

In the cassette housing stage 14, two cassettes 24 are detachably set, and a number of wafers 26 of which reverses have not been ground are housed in these cassettes 24. Each of the wafers 26 is held by a transporting robot 28 and is transported in an order to the alignment stage 16 of the next process. The transporting robot 28 is suspended through an elevator 32 from a beam 30, which is erected at the body 12. The elevator 32 is connected to a feeding screw unit (not shown), which is built in the beam 30. The elevator 32 is moved by the feeding screw unit so that the transporting robot 28 is moved along the beam 30 to the directions of arrows A and B in FIGS. 2 and 3. The wafer 26 is transported on a preset route in the back grinder 10 by the movement and operation of the transporting robot 28.

The transporting robot 28 is a common industrial robot, and comprises a horseshoe-shaped arm 34, by which the wafer 26 is held by suction, and three links 36, 38 and 40. A pair of holding pads 35, which hold the wafer 26, are provided at ends of the arm 34. A base end part of the arm 34 is supported at the link 36 rotatably around the axis thereof, and the arm 34 can be rotated around the axis by a driving power from a motor (not shown). The link 36 is turnably connected to the link 38 through a pivot 42, and can be turned around the pivot 42 by a driving power from a motor (not shown). The link 38 is turnably connected to the link 40 through a pivot 44, and can be turned around the pivot 44 by a driving power from a motor (not shown). The link 40 is connected to an output shaft of a motor (not shown) through a shaft 46, and can be turned around the shaft 46 by the motor, which is connected to an elevator rod (not shown) of the elevator 32. In the robot 28, the movements of the arm 34 and the three links 36, 38 and 40 are controlled with rotations of the motors and expansion and contraction movements of the elevator rod of the elevator 32, so that the wafer 26 in the cassette 24 is held by suction by the holding pad 35, is taken out of the cassette 24 and is transported to the alignment stage 16.

In the alignment stage 16, the wafer 26, which is transported from the cassette 24, is aligned at a predetermined position according to a position of a notch or an orientation flat formed on the wafer 26. The wafer 26 that has been aligned at the alignment stage 16 is held by suction again by the holding pads 35 of the transporting robot 28, and is transported to an empty chuck table 48, then is held by suction at a predetermined position of the chuck table 48.

The chuck table 48 and chuck tables 52 and 54 with the same function as the chuck table 48 are arranged on a turn table 50 at regular intervals on a circle around the rotational axis of the turn table 50. In FIGS. 2 and 3, the chuck table 52 is positioned at the rough grinding stage 18, where the held wafer 26 is roughly ground, and the chuck table 54 is positioned at the finishing grinding stage 20, where the held wafer 26 is finely ground (processed under finishing grinding and spark-out). The chuck tables 48, 52 and 54 are respectively connected to spindles of motors (not shown), which are arranged under the tables, and are rotated by the driving powers from the motors.

The thickness of the wafer 26 of which surface (the surface of the protective sheet adhered on the obverse) is held by suction on the chuck table 48 is measured by a thickness gauge (not shown) before grinding. The wafer 26 of which thickness has been measured is positioned at the rough grinding stage 18 by a turn of the turn table 50 in the direction of the arrow C in FIGS. 2 and 3, and the reverse of the wafer 26 is roughly ground with a cup-shaped grinding wheel 56 of the rough grinding stage 18. As shown in FIG. 1, the cup-shaped grinding wheel 56 is connected to an output shaft (not shown) of a motor 58, which is attached to a grinding wheel moving unit 62 through a casing 60 for supporting the motor 58. The grinding wheel moving unit 62 moves the cup-shaped grinding wheel 56 up and down along with the motor 58, and the cup-shaped grinding wheel 56 is pressed on the reverse of the wafer 26 by the descending movement of he grinding wheel moving unit 62. The reverse of the wafer 26 is thus roughly ground. The descending amount of the cup-shaped grinding wheel 56, that is, the grinding amount of the cup-shaped grinding wheel 56, is settled in accordance with a predetermined reference position of the cup-shaped grinding wheel 56 and the thickness before grinding of the wafer 26. The grinding amount is controlled with a feedback in accordance with the thickness after grinding of the wafer 26, which is measured in the cleaning and thickness measuring stage 22 as described below.

The reverse of the wafer 26 is roughly ground at the rough grinding stage 18, the cup-shaped grinding wheel 56 retreats from the wafer 26, and the thickness of the wafer 26 is then measured by the thickness gauge (not shown). The wafer 26 of which thickness has been measured is positioned at the finishing grinding stage 20 by a turn of the turn table 50 in the direction of the arrow C, and is finely ground and sparked-out by a cup-shaped grinding wheel 64 of the finishing grinding stage 20 shown in FIG. 3. Since the structure of the finishing grinding stage 20 is similar to that of the rough grinding stage 18, a detailed description will be omitted.

Figure 4:
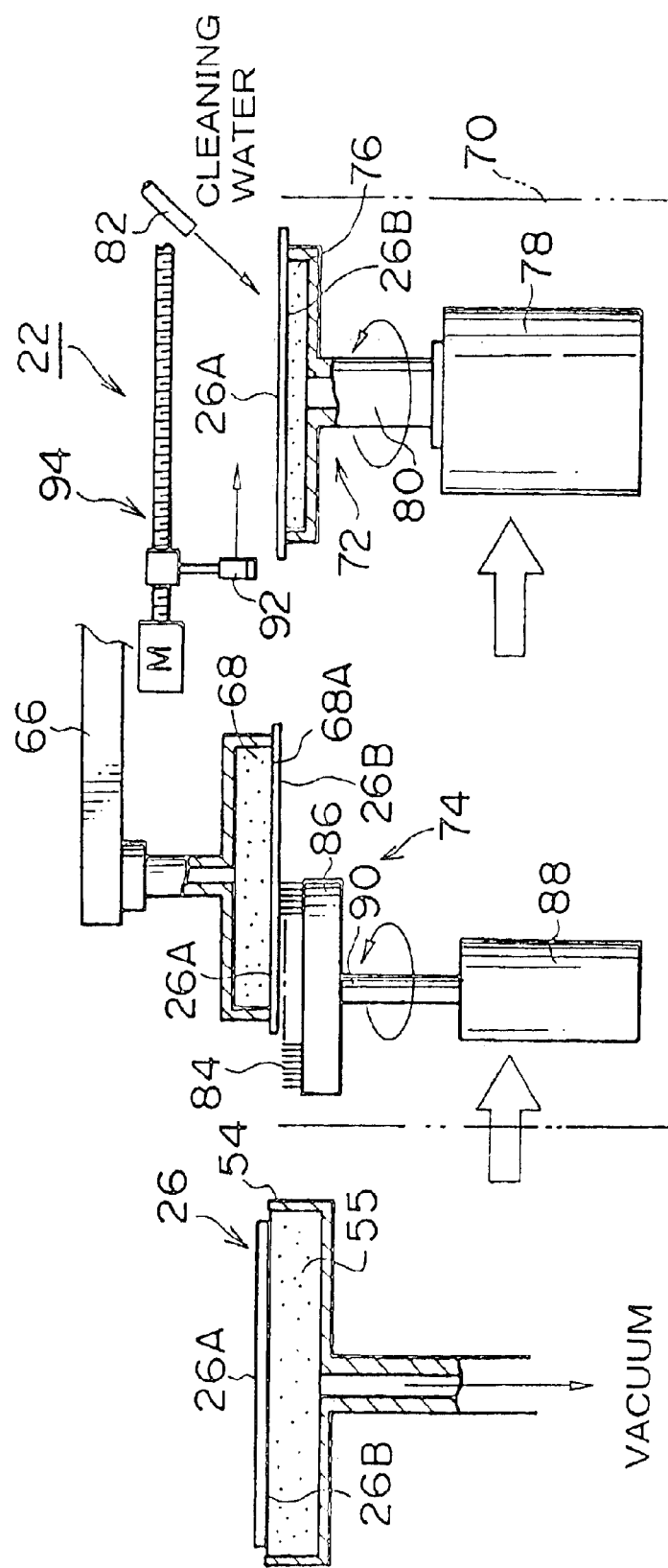
FIG. 4 is an explanatory view showing a structure of a cleaning and measuring a thickness stage of the back grinder.

The reverse of the wafer 26 is finely ground at the finishing grinding stage 20, the cup-shaped grinding wheel 64 retreats from the wafer 26, and the wafer 26 is then transported at the position of the empty chuck table 48 in FIG. 2 by a turn of the turn table 50 in the direction of the arrow C. Then, the wafer 26 is held by a disk-shaped holding pad 68 provided at an end of a transporting arm 66 as shown in FIG. 4. The holding pad 68 includes a porous member having a holding face 68A, of which diameter is substantially the same with the wafer 26. The wafer 26 held on the holding face 68A is transported to the cleaning and thickness measuring stage 22 by a turn of the transporting arm 66 in the direction of an arrow D shown in FIG. 2.

As shown in FIGS. 2 to 4, the cleaning and thickness measuring stage 22 comprises a cleaning part, which has a brush cleaning unit 74 and a spin cleaning unit 72 arranged in a sink 70, and a thickness measuring part including a capacitance sensor 92.

As shown in FIG. 4, the brush cleaning unit 74 has a disk-shaped plate 82, and a brush 84 is arranged on the upper face of the plate 82. A spindle 90 of a motor 88 is connected to the bottom face of the plate 86. In the brush cleaning unit 74, the brush 84 is rotated by the motor 88, and is pressed on a surface of the protective sheet adhered on the obverse 26B of the wafer 26 that is held by the holding pad 68 of the transporting arm 66. Thus, sludge, etc. adhering over the protective sheet on the wafer 26 are removed.

The spin cleaning unit 72 has a holding pad 76 of substantially the same diameter with the wafer 26, and a spindle 80 of a motor 78 is connected to the bottom face of the holding pad 76. A nozzle 82 jetting cleaning water is provided above the holding pad 76. In the spin cleaning unit 72, the wafer 26 held on the holding pad 76 is rotated by the motor 78 and the cleaning water is jetted onto the reverse 26A of the wafer 26 from the nozzle 82. Thus, sludge, etc. adhering over the reverse 26A of the wafer 26 are removed.

The thickness measuring unit including the capacitance sensor 92 is arranged above the spin cleaning unit 72. The capacitance sensor 92 measures the capacitance of the wafer 26 to determine the thickness of the wafer 26, and is arranged to face the reverse 26A of the wafer 26. The capacitance sensor 92 is moved by a feeding screw unit 94 in the diametrical direction of the wafer 26 held on the holding pad 76. While the capacitance sensor 92 is moved by the feeding screw unit 94, the capacitance sensor 92 measures the thickness of the wafer 26 at a plurality of measuring points. The thickness information is outputted from the capacitance sensor 92 to a calculation unit (not shown), and the thickness of the wafer 26 is calculated by the calculation unit. In the case where the calculated thickness of the wafer 26 is larger than a predetermined thickness, the wafer 26 is held by the holding pad 68 of the transporting arm 66, is returned on the chuck table 48, and is ground again in the above-described procedure.

Hereinafter, operations of the above-described cleaning and thickness measuring stage 22 will be explained.

The wafer 26 that has been finely ground is held on the chuck table 54 with the reverse 26A facing up as shown in FIG. 4, and the protective sheet adhered on the obverse 26B of the wafer 26 is held on the holding pad 55 by suction. In this state, the reverse 26A of the wafer 26 is held by the holding pad 68 of the transporting arm 66, and the suction of the chuck table 54 is stopped. Then, the transporting arm 66 is turned to transport the wafer 26 to the cleaning and thickness measuring stage 22.

In the cleaning and thickness measuring stage 22, the wafer 26 is held by suction on the holding pad 68, and the brush 84 of the brush cleaning unit 74 is pressed to the protective sheet adhered on the obverse 26B of the wafer 26. Then, the brush 84 is rotated, and the brush 84 and the wafer 26 are relatively moved horizontally. Thus, the surface of the protective sheet is entirely in contact with the brush 84, and sludge, etc. adhering on the protective sheet are fully washed off.

After the protective sheet is cleaned, the wafer 26 is transferred to the spin cleaning unit 72 by the turning movement of the transporting arm 66. Then, the protective sheet of the wafer 26 is held by suction on the holding pad 76 of the spin cleaning unit 72. In this state, the cleaning water is jetted onto the reverse 26A of the wafer 26 from the nozzle 82 while the wafer 26 is rotated by the motor 78, so that the reverse 26A is cleaned. After the predetermined time passes, the jetting of the cleaning water is stopped to finish the cleaning, and the wafer 26 is still rotated to dry. Upon finishing the drying, the rotation of the wafer 26 is stopped, and the thickness of the wafer 26 is measured by the capacitance sensor 92 as described above. The procedures in the cleaning and thickness measuring stage 22 are thus completed.

The wafer 26 of which thickness has been measured is again held by suction by the holding pad 68 of the transporting arm 66, and is transported to an ultraviolet (UV) irradiating unit 96 in FIG. 1. The wafer 26 is arranged at a predetermined UV irradiation position in the UV irradiating unit 96, and the surface of the protective sheet adhered on the obverse 26B of the wafer 26 is dried by air blowing. Then, the protective sheet is irradiated with UV rays so that the adhesive made from a resin to be hardened by the UV rays is hardened. Thus, it is made possible to easily peel the protective sheet from the obverse 26B of the wafer 26.

Figure 5:
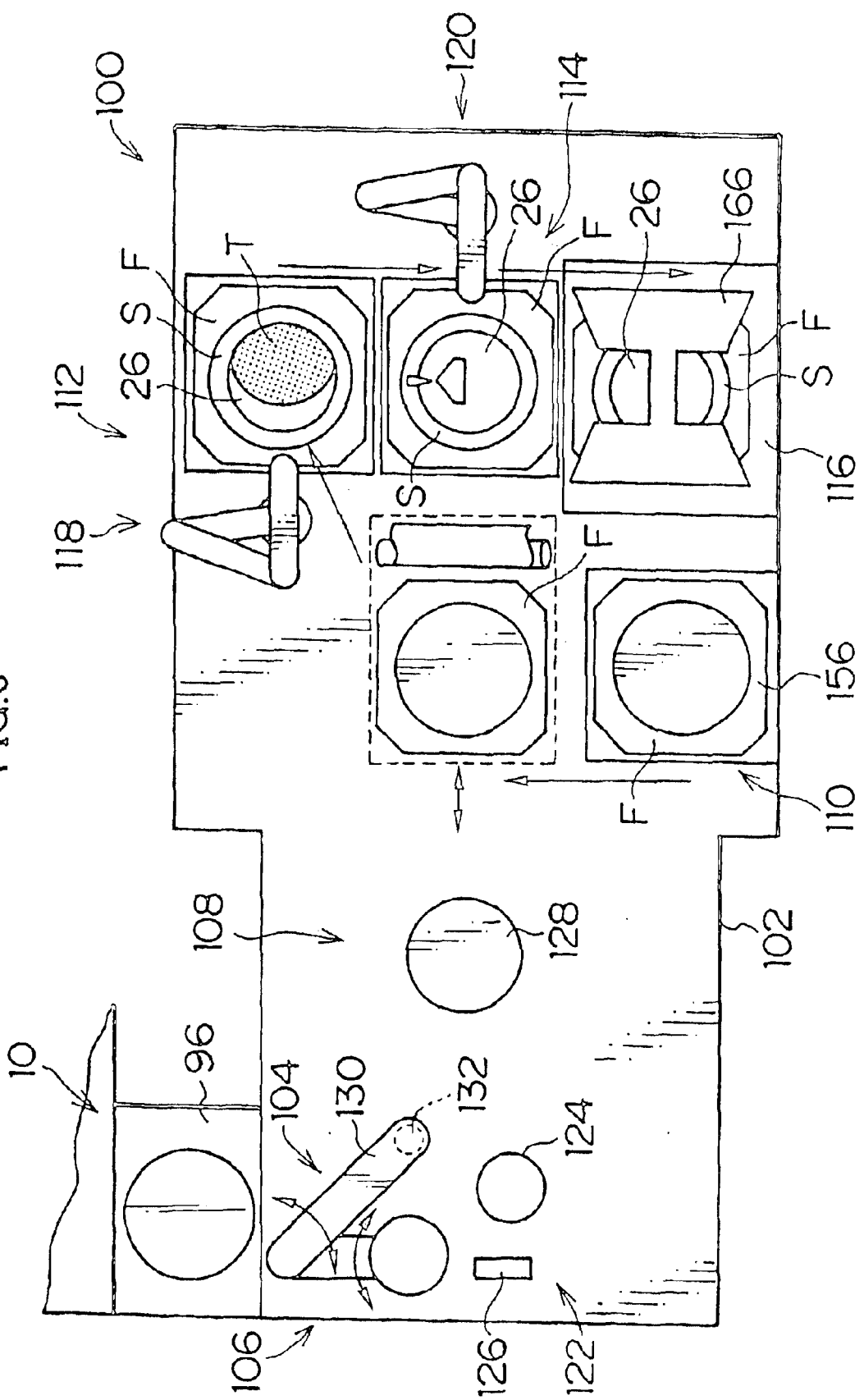
FIG. 5 is a plan view showing a structure of a wafer processing apparatus.

Thereafter, the wafer 26 is held by suction by a wafer transporting robot 104 provided at a body 102 of the wafer processing apparatus 100 shown in FIG. 5, and the wafer 26 is transported to the wafer processing apparatus 100.

The wafer processing apparatus 100 comprises a wafer supplying part 106, a frame adhering part or a mounting part 108, a wafer frame supplying part 110, a peeling part or a protective sheet peeling part 112, a cleaning unit 114, a wafer frame mount 116 and transporting robots 118 and 120.

The wafer supplying part 106 comprises an alignment unit 122 and the wafer transporting robot 104. The alignment unit 122 aligns the wafer 26 to be transported to the mounting part 108. The alignment unit 122 comprises a measuring table 124 and an alignment sensor 126. The wafer 26 held on the measuring table 124 is rotated, and a position of the notch or the orientation flat formed on the wafer 26 and a center position of the wafer 26 are determined by the alignment sensor 126. Then, the wafer 26 is aligned according to the determined result. More specifically, the measuring table 124 is rotated so that the notch or the orientation flat formed on the wafer 26 faces a predetermined direction, and the wafer 26 is then transported on a chuck table 128 of the mounting part 108 by the wafer transporting robot 104 so that the center of the wafer 26 is fit on the center of the chuck table 128.

The wafer transporting robot 104 transports the wafer 26 from the UV irradiating unit 96 to the alignment unit 122, and from the alignment unit 122 to the chuck table 128 of the mounting part 108. The wafer transporting robot 104 is a common industrial robot, and comprises an arm 130 and a holding pad 132, which is provided at an end part of the arm 130. The wafer 26 is held by suction by the holding pad 132 so as to be transported.

Figure 6:
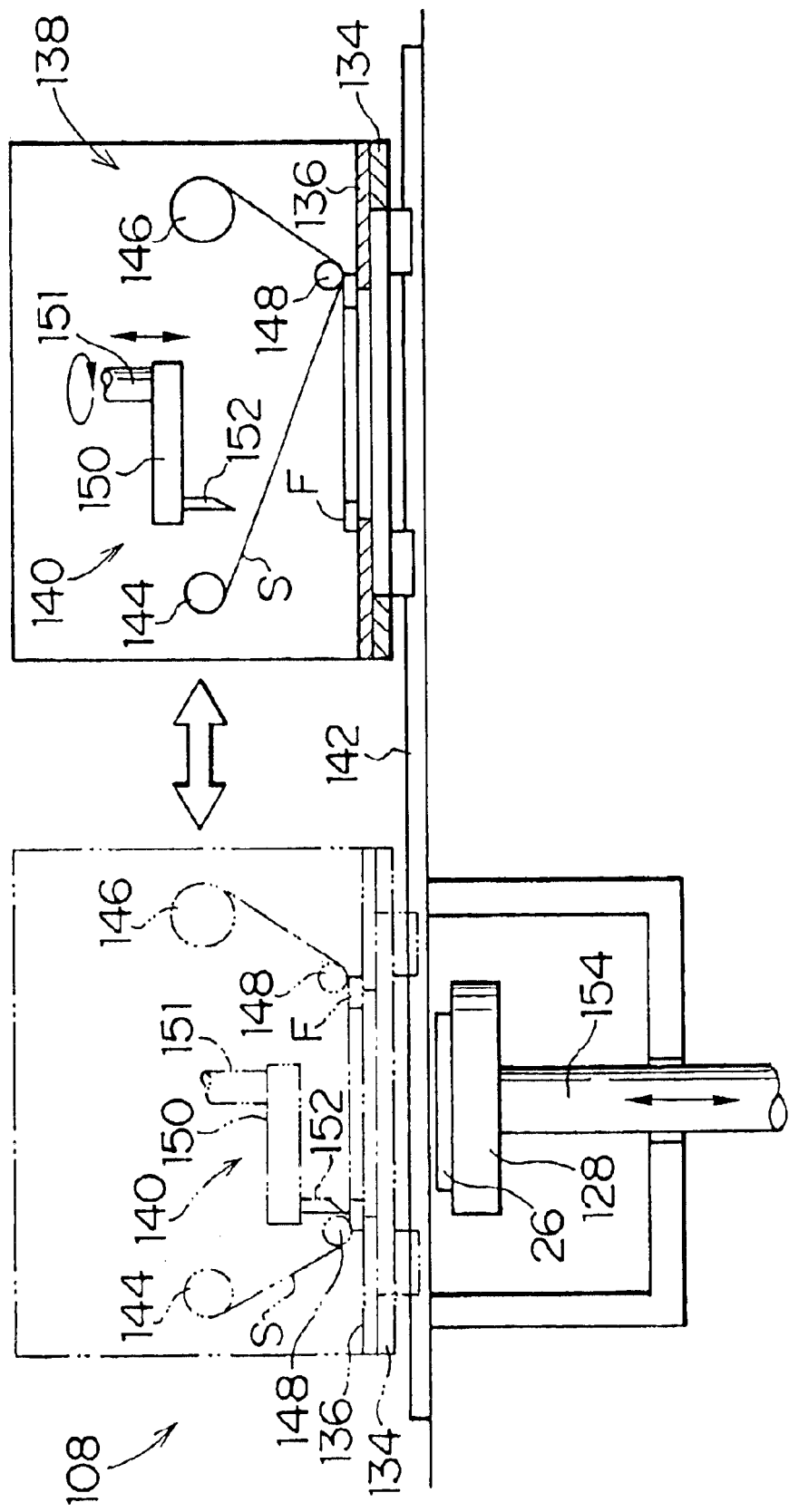
FIG. 6 is a side view showing a structure of a mounting part of the wafer processing apparatus in FIG. 5.

In the mounting part 108, the wafer 26 held on the chuck table 128 is mounted on a wafer frame F for dicing through a wafer sheet S. More specifically, the wafer 26 is adhered to the wafer sheet S adhered on the wafer frame F. As shown in FIG. 6, the mounting part 108 comprises a moving body 134, a holder 136, a wafer sheet adhering unit 138 and a wafer sheet cutting unit 140.

The moving body 134 is slidably arranged on guide rails 142 (one of the guide rails 142 is shown in FIG. 6), and is moved on the guide rails 142 by a feeding unit (not shown) such as a feeding screw mechanism and a cylinder, so that the moving body 134 can be moved back and forth between a predetermined wafer frame receiving position and a mounting position, which is settled above the chuck table 128. The holder 136 is arranged on the moving body 134 to hold the wafer frame F.

The wafer sheet adhering unit 138 and the wafer sheet cutting unit 140 are arranged on the moving body 134. The wafer sheet adhering unit 138 comprises a wafer sheet supplying roll 144, on which a length of wafer sheet S is wound, a wafer sheet winding roll 146, which winds up the wafer sheet S unwound from the wafer sheet supplying roll 144, and a wafer sheet pressing roller 148, which presses and adheres the wafer sheet S onto the wafer 26 and the upper face of the wafer frame F. The wafer sheet cutting unit 140 comprises a cutting arm 150, which can be rotated around an axis 151 and vertically moved, and a cutter 152 provided at an end of the cutting arm 150.

Hereinafter, operations of the above-described mounting part 108 will be explained. The mounting part 108 is positioned at the wafer frame receiving position at the beginning, and the wafer frame F is supplied from the wafer frame supplying part 110 to the mounting part 108, on which the wafer frame F is loaded onto the holder 136.

After that, the moving body 134 is moved to the mounting position represented with alternate long and two short dashes lines in FIG. 6. In this state, the center of the wafer frame F held by the holder 136 is fit on the center of the wafer 26 held on the chuck table 128.

Then, the chuck table 128 is moved up by extension of a piston 154 of an air cylinder unit to a predetermined adhesive position. In this state, the reverse (the upper face) of the wafer 26 is even with the upper face of the wafer frame F.

Next, the wafer sheet pressing roller 148 is moved down by a predetermined amount so that the wafer sheet S is pressed on the wafer frame F. Then, the wafer sheet pressing roller 148 is moved along the upper face of the wafer frame F, so that the wafer sheet S is adhered onto the upper face (the reverse) of the wafer 26 and the upper face of the wafer frame F.

Thereafter, the cutting arm 150 is moved down by a predetermined amount so that the edge of the cutter 152 is pressed toward the upper face of the wafer frame F, and the cutting arm 150 is rotated around the axis 151. Superfluous peripheral parts of the wafer sheet S adhered on the wafer frame F are thus cut off by the cutter 152.

Upon the cutting, the cutting arm 150 is moved up by a predetermined amount, and the wafer sheet pressing roller 148 is returned to its original position. Then, the wafer sheet winding roll 146 is driven to wind up the superfluous wafer sheet S. After the suction of the chuck table 128 to the wafer 26 is stopped, the chuck table 128 is moved down by a predetermined amount to a predetermined waiting position.

The procedures to mount the wafer 26 on the wafer frame F are thus finished, and the moving body 134 is returned to the wafer frame receiving position.

The wafer frame supplying part 110 supplies the wafer frame F to the holder 136 of the mounting part 108 positioned at the wafer frame receiving position. As shown in FIG. 5, the wafer frame supplying part 110 comprises a wafer frame stocker 156, in which a plurality of the wafer frames F are stacked and stored, and a wafer frame supplying robot (not shown), which transports the wafer frame F to the holder 136 of the mounting part 108 positioned at the wafer frame receiving position.

The protective sheet peeling part 112 peels the protective sheet T from the obverse of the wafer 26 mounted in the wafer frame F. In the protective sheet peeling part 112 in FIG. 7, an adhesive sheet 160 is unwound from an adhesive sheet supplying roll 158 in a state where the adhesive face of the adhesive sheet 160 faces downward, and the adhesive sheet 160 is pressed and adhered to the upper surface of the protective sheet T on the obverse of the wafer 26 by an adhesive sheet pressing roller 162. Then, the adhesive sheet 160 is wound up by an adhesive sheet winding roll 164, so that the protective sheet T is peeled from the obverse of the wafer 26.

The cleaning unit 114 in FIG. 5 cleans the obverse of the wafer 26 from which the protective sheet T has been peeled with jetting and scrubbing. That is, the wafer 26 is held by suction on a turn table provided in a cleaning vessel, and is rinsed with jetted cleaning water while being rotated. Then, a rotating brush is pressed to the obverse of the rotating wafer 26 so that the wafer 26 is scrubbed. Then, the cleaning water is jetted onto the wafer 26 with low pressure with the wafer 26 being rotated so that the wafer 26 is cleaned with low-pressure jetting. Thereafter, the cleaning water is jetted onto the wafer 26 with the wafer 26 being rotated so that the wafer 26 is rinsed, and air is jetted onto the wafer 26 with the wafer 26 being rotated so that the wafer 26 is dried by spinning.

A wafer frame cassette 166, which can stores a number of the wafer frames F on which the wafers 26 are mounted, is set on the wafer frame mount 116.

The transporting robot 118 takes the wafer frame F out of the holder 136 of the mounting part 108 positioned at the wafer frame receiving position, turns the wafer frame F over, and transports the wafer frame F to the protective sheet peeling part 112. Since the transporting robot 118 is a common industrial robot and the detailed structure of the transporting robot 118 is well-known, the description will be omitted.

The transporting robot 120 transports the wafer frame F from the protective sheet peeling part 112 to the cleaning unit 114. The transporting robot 120 also takes the wafer frame F out of the cleaning unit 114, and puts the wafer frame F in the wafer frame cassette 166 set on the wafer frame mount 116. The transporting robot is a common industrial robot same as the transporting robot 118.

As explained above, the wafer planarization apparatus 1 of the embodiment has the back grinder 10, the mounting part 108 and the protective sheet peeling part 112, and is provided with the transporting arm 66, which transports the wafer 26 from the back grinder 10 to the mounting part 108, and the transporting robot 118, which transports the wafer 26 from the mounting part 108 to the protective sheet peeling part 112. Thus, a series of processes of grinding the reverse of the wafer, adhering the wafer to the wafer frame, then peeling the protective sheet from the wafer, is systematized in line in the wafer planarization apparatus. The wafer planarization apparatus 1 of the embodiment is further provided with the thickness measuring unit, in which the capacitance sensor 92 measures the thickness of the wafer 26 of which reverse has been ground, between the back grinder 10 and the mounting part 108, so that a series of processing of grinding the reverse of the wafer, measuring the thickness of the wafer, adhering the wafer to the wafer frame, then peeling the protective sheet from the wafer, can be systematized in line.

In the wafer planarization apparatus 1 of the embodiment, if the thickness of the wafer 26 measured by the capacitance sensor 92 is larger than the predetermined thickness, the wafer 26 is returned to the chuck table 48 with the holding pad 68 of the transporting arm 66 and is ground again. Thus, it can improve the yield of the wafer.

In the present embodiment, the capacitance sensor 92 is applied as the measuring device for the thickness of wafer; however, any other device measuring the thickness of wafer can substitute for the capacitance sensor 92. In the present embodiment, the capacitance sensor 92 is moved over the wafer 26 so as to measure the thickness of the wafer 26; however another structure can be used where the capacitance sensor 92 is fixed and the thickness of the wafer 26 is measured while the wafer 26 is transported over the capacitance sensor 92 by the transporting arm 66.

In the present embodiment, the thickness measuring unit is applied as the wafer inspecting device; however, the wafer inspecting device is not limited to the thickness measuring unit. A visual inspecting device including a camera to image to visually inspects the wafer for breaks can be used substitutively for or additionally to the thickness measuring unit. Instead of the visual inspecting device, a window and so forth through which the appearance of the wafer 26 is visually inspected can be provided to the wafer planarization apparatus 1.

It should be understood, however, that there is no intention to limit the invention to the specific forms disclosed, but on the contrary, the invention is to cover all modifications, alternate constructions and equivalents falling within the spirit and scope of the invention as expressed in the appended claims.

What is claimed is:

1. A wafer planarization apparatus, comprising:

a processing part which holds a wafer through a protective sheet adhering to a first surface of the wafer and processes a second surface of the wafer;

an inspecting device which inspects the wafer having been processed by the processing part;

a frame adhering part which adheres a frame through a sheet to the second surface of the wafer having been inspected by the inspecting device;

a peeling part which peels the protective sheet from the wafer to which the frame has been adhered; and a transporting device which transports the wafer between the processing part, the inspecting device, the frame adhering part, and the peeling part;

wherein the inspecting device is located within the planarization apparatus between the processing part and the frame adhering part, wherein the inspecting device comprises a thickness measuring device which measures a thickness of the wafer, and the inspecting device rejects the wafer of which thickness is thicker than a predetermined thickness.

2. A wafer planarization apparatus, comprising:

a processing part which holds a wafer through a protective sheet adhering to a first surface of the wafer and processes a second surface of the wafer;

an inspecting device which inspects the wafer having been processed by the processing part;

a frame adhering part which adheres a frame through a sheet to the second surface of the wafer having been inspected by the inspecting device;

a peeling part which peels the protective sheet from the wafer to which the frame has been adhered; and a transporting device which transports the wafer between the processing part, the inspecting device, the frame adhering part, and the peeling part;

wherein the inspecting device is located within the planarization apparatus between the processing part and the frame adhering part, wherein the inspecting device comprises a visual inspecting device which visually inspects the wafer for breaks.

3. A wafer planarization apparatus, comprising:

a processing part which holds a wafer through a protective sheet adhering to a first surface of the wafer and processes a second surface of the wafer;

an inspecting device which inspects the wafer having been processed by the processing part;

a frame adhering part which adheres a frame through a sheet to the second surface of the wafer having been inspected by the inspecting device;

a peeling part which peels the protective sheet from the wafer to which the frame has been adhered; and a transporting device which transports the wafer between the processing part, the inspecting device, the frame adhering part, and the peeling part;

wherein the inspecting device is located within the planarization apparatus between the processing part and the frame adhering part, wherein:

the transporting device transports the wafer having been processed by the processing part to the inspecting device; and the transporting device transports the wafer having been accepted by the inspecting device to the frame adhering part, and transports the wafer having been rejected by the inspecting device to the processing part so as to reprocess the wafer.

4. The wafer planarization apparatus according to claim 3, wherein the inspecting device comprises a thickness measuring device which measures a thickness of the wafer, and the inspecting device rejects the wafer of which thickness is thicker than a predetermined thickness.

5. The wafer planarization apparatus according to claim 3, wherein the inspecting device comprises a visual inspecting device which visually inspects the wafer for breaks.

* * * * *